US011465350B2

(12) United States Patent
Iimura et al.

(10) Patent No.: US 11,465,350 B2
(45) Date of Patent: Oct. 11, 2022

(54) EJECTION DEVICE, IMPRINT APPARATUS, AND DETECTION METHOD

(71) Applicant: CANON KABUSHIKI KAISHA, Tokyo (JP)

(72) Inventors: Akiko Iimura, Utsunomiya (JP); Noriyasu Hasegawa, Utsunomiya (JP); Yoshimasa Araki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 20 days.

(21) Appl. No.: 17/012,279

(22) Filed: Sep. 4, 2020

(65) Prior Publication Data
US 2021/0069977 A1 Mar. 11, 2021

(30) Foreign Application Priority Data

Sep. 11, 2019 (JP) .............................. JP2019-165640

(51) Int. Cl.
*B29C 64/227* (2017.01)
*B29C 64/112* (2017.01)
(Continued)

(52) U.S. Cl.
CPC .......... *B29C 64/227* (2017.08); *B29C 64/112* (2017.08); *B29C 64/209* (2017.08);
(Continued)

(58) Field of Classification Search
CPC ............ B41J 2002/14354; B41J 2/2142; B41J 29/393; B41J 2/14153; B41J 2/0451; B41J 2/04581; B41J 2/14233; B41J 2/16579; B41J 3/543; B29C 64/112; B29C 64/209; B29C 64/227; B29L 2031/34; G03F 7/0002
See application file for complete search history.

(56) References Cited

U.S. PATENT DOCUMENTS

| 6,056,387 A * | 5/2000 | Kaneko ................ B41J 2/16579 347/23 |
| 6,435,672 B1 | 8/2002 | Groeninger et al. |
| 7,503,647 B2 | 3/2009 | Zhang |
| 7,578,567 B2 | 8/2009 | Zhang et al. |

(Continued)

FOREIGN PATENT DOCUMENTS

| JP | 2001-047639 A | 2/2001 |
| JP | 2006-194854 A | 7/2006 |

(Continued)

OTHER PUBLICATIONS

Kawahara et al., U.S. Appl. No. 16/766,384, filed May 22, 2020.
Namba et al., U.S. Appl. No. 17/012,265, filed Sep. 4, 2020.
Namba et al., U.S. Appl. No. 17/012,287, filed Sep. 4, 2020.

*Primary Examiner* — Jannelle M Lebron
(74) *Attorney, Agent, or Firm* — Venable LLP

(57) ABSTRACT

An ejection device includes: an ejection unit provided with an ejection port configured to eject an ejection material; a piezoelectric element configured to cause the ejection material to be ejected from the ejection unit; a first liquid chamber connected to the ejection unit and configured to supply the ejection unit with the ejection material; a pressure control unit configured to control a pressure in the ejection unit by controlling a pressure in the first liquid chamber; and a detection unit configured to detect a wetness of an ejection port side surface.

17 Claims, 11 Drawing Sheets

(51) Int. Cl.
*B29C 64/209* (2017.01)
*B41J 2/14* (2006.01)
*B41J 3/54* (2006.01)
*B41J 2/045* (2006.01)
*B41J 2/21* (2006.01)
*G03F 7/00* (2006.01)
*B29L 31/34* (2006.01)

(52) U.S. Cl.
CPC ......... *B41J 2/0451* (2013.01); *B41J 2/04581* (2013.01); *B41J 2/14233* (2013.01); *B41J 2/2142* (2013.01); *B41J 3/543* (2013.01); *G03F 7/0002* (2013.01); *B29L 2031/34* (2013.01)

(56) References Cited

U.S. PATENT DOCUMENTS

| | | |
|---|---|---|
| 7,618,105 B2 | 11/2009 | Takahashi et al. |
| 9,834,002 B2 | 12/2017 | Araki et al. |
| 10,518,546 B2 | 12/2019 | Araki et al. |
| 2002/0105566 A1* | 8/2002 | Silverbrook ......... B41J 2/16579 347/85 |
| 2019/0009524 A1* | 1/2019 | Nakamura ........... B41J 2/04581 |
| 2020/0338806 A1 | 10/2020 | Kawahara et al. |
| 2020/0341369 A1 | 10/2020 | Namba et al. |
| 2020/0376851 A1 | 12/2020 | Kuri et al. |

FOREIGN PATENT DOCUMENTS

| | | | | |
|---|---|---|---|---|
| JP | 2018160684 A | * | 10/2018 | .......... B41J 2/17566 |
| WO | 2019/107383 A1 | | 6/2019 | |

* cited by examiner

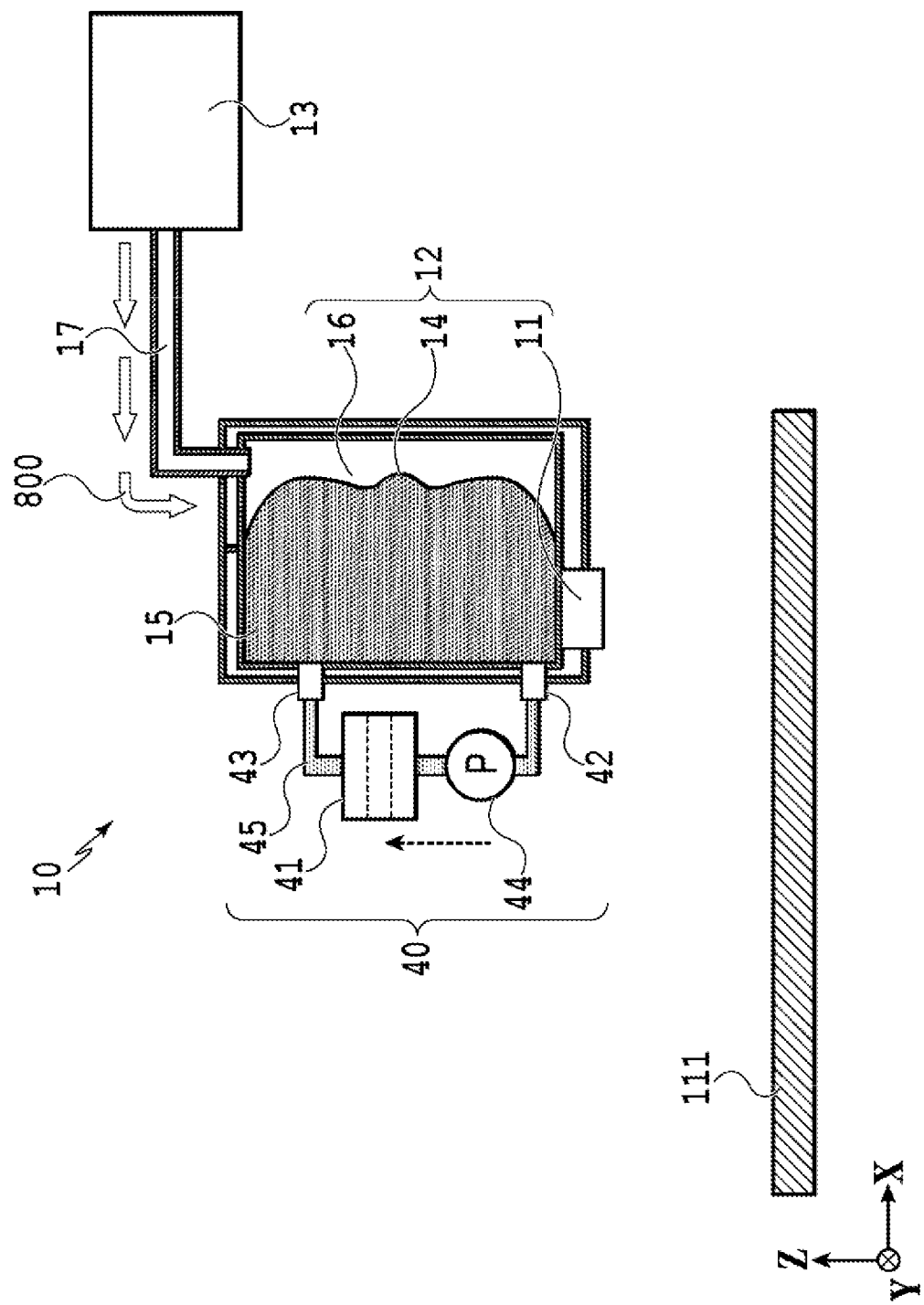

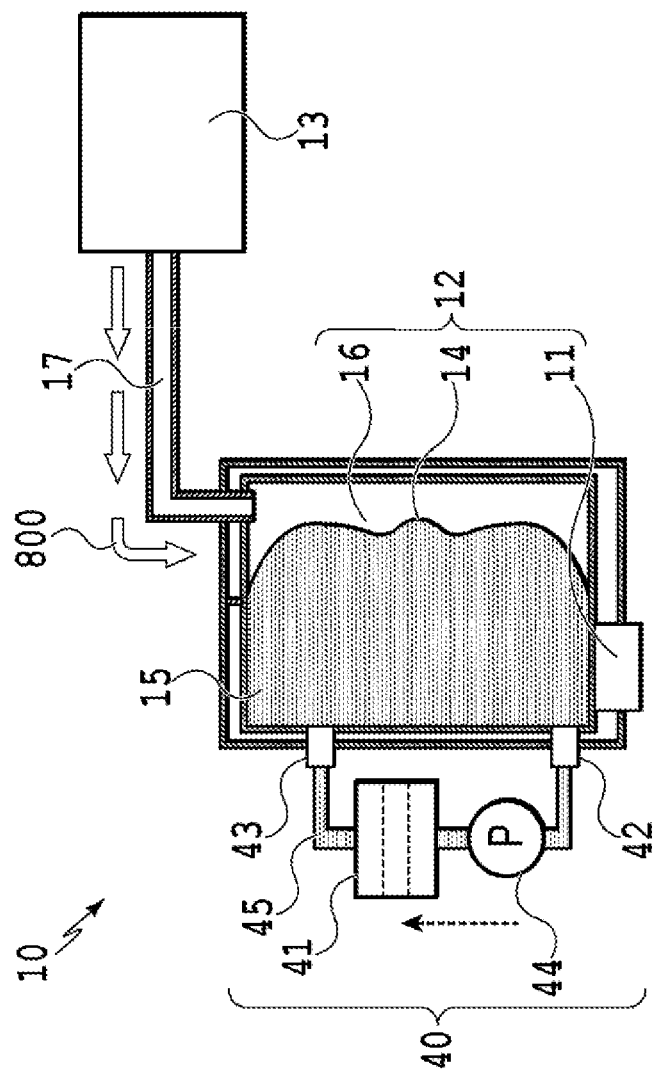
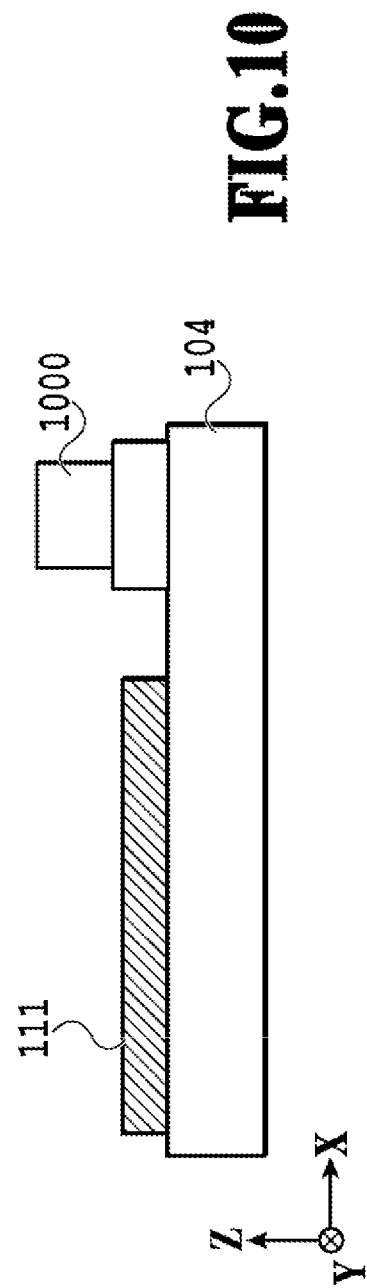
FIG.10

EJECTION DEVICE, IMPRINT APPARATUS, AND DETECTION METHOD

BACKGROUND OF THE INVENTION

Field of the Invention

The present invention relates to an ejection device that ejects an ejection material, an imprint apparatus, and a detection method.

Description of the Related Art

There have been ejection material ejection devices each of which includes a piezoelectric element in a pressure chamber and ejects an ejection material by applying a driving pulse to the piezoelectric element. One of such ejection material ejection devices has a configuration in which a residual vibration of a vibration unit that is generated after forcibly vibrating the vibration unit by applying a driving pulse to the piezoelectric element is detected as a back electromotive force by the same piezoelectric element.

Japanese Patent Laid-Open No. 2001-47639 (hereinafter, PTL 1) discloses a technique of detecting whether there is a failure in a pressure chamber based on a back electromotive force and recovering from the failure by providing standby time or the like. Japanese Patent Laid-Open No. 2006-194854 (hereinafter, PTL 2) discloses a technique of detecting a remaining amount of an ejection liquid based on a back electromotive force.

However, both the PTLs 1 and 2 are the techniques of detecting a state of the inside of an ejection port and are incapable of detecting a phenomenon such as leaking of an ejection material from the ejection port.

SUMMARY OF THE INVENTION

An ejection device according to an aspect of the present invention includes: an ejection unit provided with an ejection port configured to eject an ejection material; an energy generation element provided in the ejection unit and configured to cause the ejection material to be ejected from the ejection port; a first liquid chamber connected to the ejection unit and configured to supply the ejection unit with the ejection material; and a pressure control unit configured to control a pressure in the ejection unit by controlling a pressure in the first liquid chamber and control the first liquid chamber to have a negative pressure while the ejection material is ejected by the energy generation element. The ejection device includes a detection unit configured to detect a wetness on a surface of the ejection port.

Further features of the present invention will become apparent from the following description of exemplary embodiments with reference to the attached drawings.

BRIEF DESCRIPTION OF THE DRAWINGS

FIG. 8 is a diagram describing a configuration of an ejection device;
FIG. 10 is a diagram describing a configuration of an ejection device.

DESCRIPTION OF THE EMBODIMENTS

Figure 1:
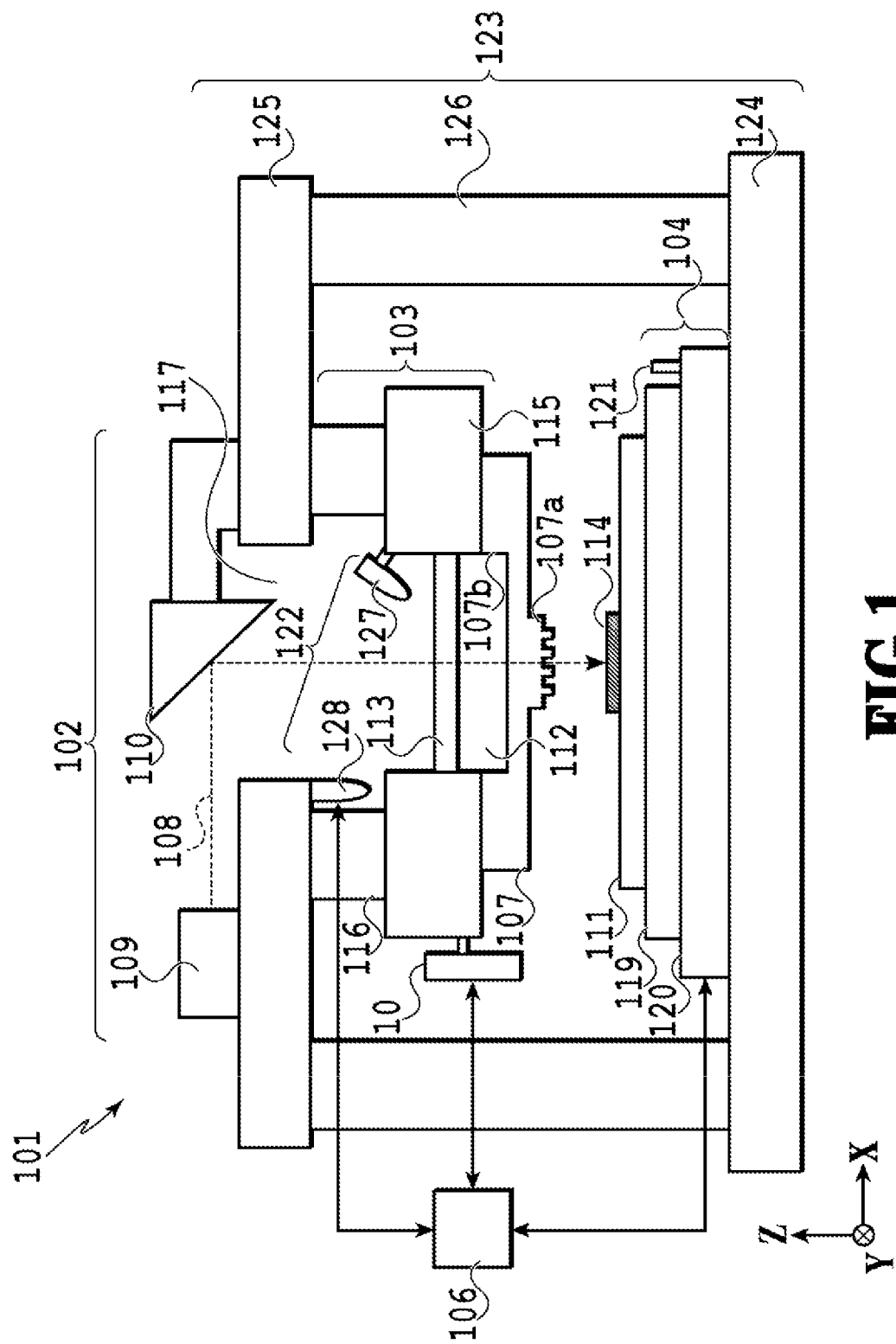
FIG. 1 is a schematic diagram illustrating a configuration of an imprint apparatus.

Hereinafter, embodiments are described with reference to the drawings. The same configurations are described with the same reference numerals assigned thereto. The relative arrangement, shapes, and the like of the constituents described in the embodiments are merely examples.

First Embodiment

In a first embodiment, an ejection material ejection device (hereinafter, also simply referred to as an "ejection device") applied to an imprint apparatus to eject an ejection material is described. A configuration of detecting a wetness of an ejection unit surface in the ejection device is described. Hereinafter, an overall configuration of the imprint apparatus is described first, and then an overall configuration of the ejection device is described.

<Imprint Apparatus>

FIG. 1 is a schematic diagram illustrating a configuration of an imprint apparatus 101 applicable to the present embodiment. The imprint apparatus 101 is used in manufacture of various devices including a semiconductor device. The imprint apparatus 101 includes an ejection device 10. The ejection device 10 ejects an ejection material 114 (resist) on a substrate 111. The ejection material 114 is a photocurable resin having properties of curing by receiving ultraviolet rays 108. The ejection material 114 is arbitrarily selected depending on various conditions such as the semiconductor device manufacture steps. For example, other than the photocurable one, a thermosetting resist may be used as the ejection material, and the imprint apparatus may be an apparatus that performs the imprint processing by curing the resist by heat. The ejection material 114 may be called an imprint material.

The imprint apparatus 101 performs the imprint processing including the following series of processing. Specifically, the imprint apparatus 101 causes the ejection device 10 to eject the ejection material 114 on the substrate 111. Then, a mold 107 including a pattern for molding is impressed on the ejection material 114 ejected on the substrate 111, and the ejection material 114 is cured by being irradiated with light (ultraviolet rays) with the mold 107 impressed. Thereafter, the mold 107 is pulled away from the cured ejection material 114, and thus the pattern of the mold 107 is transferred on the substrate 111.

The imprint apparatus 101 includes a light irradiation unit 102, a mold holding mechanism 103, a substrate stage 104, the ejection device 10, a control unit 106, a measuring unit 122, and a housing 123.

The light irradiation unit 102 includes a light source 109 and an optical element 110 that corrects the ultraviolet rays 108 radiated from the light source 109. The light source 109 is a halogen lamp that generates i-line or g-line, for example.

The ultraviolet rays 108 are radiated to the ejection material 114 through the mold 107. The wavelength of the ultraviolet rays 108 is a wavelength depending on the ejection material 114 to be cured. In the case where the imprint apparatus uses the thermosetting resist as the resist, a heat source unit for curing the thermosetting resist is provided instead of the light irradiation unit 102.

The mold holding mechanism 103 includes a mold chuck 115 and a mold driving mechanism 116. The mold 107 held by the mold holding mechanism 103 has a rectangular circumference, and a surface facing the substrate 111 includes a pattern portion 107a in which a three-dimensional bumpy pattern such as a circuit pattern to be transferred is formed. The material of the mold 107 in the present embodiment is a material that allows the ultraviolet rays 108 to penetrate therethrough, and a quartz may be used, for example.

The mold chuck 115 holds the mold 107 by vacuum sucking or electrostatic force. The mold driving mechanism 116 moves while holding the mold chuck 115 to move the mold 107. The mold driving mechanism 116 can impress the mold 107 to the ejection material 114 by moving the mold 107 in the −Z direction. The mold driving mechanism 116 can pull away the mold 107 from the ejection material 114 by moving the mold 107 in the +Z direction. A linear motor or an air cylinder may be used as an actuator adoptable in the mold driving mechanism 116, for example.

The mold chuck 115 and the mold driving mechanism 116 each include an opening region 117 in the center. The mold 107 includes a concaved cavity 107b on a surface to be irradiated with the ultraviolet rays 108. The opening region 117 of the mold driving mechanism 116 is provided with a light transmissive member 113, and a closed space 112 surrounded by the light transmissive member 113, the cavity 107b, and the opening region 117 is formed. The pressure in the space 112 is controlled by a pressure correction device (not illustrated). The pressure correction device sets the pressure in the space 112 higher than the pressure outside to cause the pattern portion 107a to bend to be convex toward the substrate 111. Accordingly, the center of the pattern portion 107a comes in contact with the ejection material 114. Consequently, it is possible to inhibit gas (air) from being captured between the pattern portion 107a and the ejection material 114 while the mold 107 is impressed to the ejection material 114 and to fill the bumpy portions of the pattern portion 107a completely with the ejection material 114. The depth of the cavity 107b that determines the size of the space 112 is arbitrarily changed depending on the size or the material of the mold 107.

The substrate stage 104 includes a substrate chuck 119, a substrate stage housing 120, and a stage reference mark 121. The substrate 111 held by the substrate stage is a single crystal silicon substrate or a silicon on insulator (SOI) substrate, and the ejection material 114 is ejected on a processed surface of the substrate 111 to form the pattern.

The substrate chuck 119 holds the substrate 111 by vacuum sucking. The substrate stage housing 120 moves in the X direction and the Y direction while holding the substrate chuck 119 by a mechanical unit to move the substrate 111. The stage reference mark 121 is used to set a reference position of the substrate 111 during alignment of the substrate 111 and the mold 107.

A linear motor may be used as an actuator of the substrate stage housing 120, for example. Otherwise, the actuator of the substrate stage housing 120 may have a configuration including multiple driving systems such as a coarse motion driving system and a slight motion driving system.

The ejection device 10 ejects the uncured ejection material 114 in the liquid form from a nozzle and applies the ejection material 114 on the substrate 111. In the present embodiment, a method of pressing out the ejection material 114 from an ejection port by using the piezoelectric effect of a piezoelectric element is adopted. The later-described control unit 106 generates a driving waveform for driving the piezoelectric element and applies the driving waveform to the piezoelectric element to drive the piezoelectric element such that the piezoelectric element is deformed into a shape proper for the ejection. Multiple nozzles that are independently controllable are provided. The amount of the ejection material 114 ejected from the nozzles of the ejection device 10 is arbitrarily determined depending on the desired thickness of the ejection material 114 to be formed on the substrate 111 or the density of the pattern to be formed.

The measuring unit 122 includes an alignment measuring instrument 127 and an observation measuring instrument 128. The alignment measuring instrument 127 measures position displacement in the X direction and the Y direction between an alignment mark formed on the substrate 111 and an alignment mark formed on the mold 107. The observation measuring instrument 128 is an image capturing device such as a CCD camera, for example, and the observation measuring instrument 128 captures an image of the pattern of the ejection material 114 ejected on the substrate 111 and outputs the image to the control unit 106 as image information.

The control unit 106 controls operations of the constituents of the imprint apparatus 101. The control unit 106 includes a computer including a CPU, a ROM, and a RAM, for example. The control unit 106 is connected to the constituents of the imprint apparatus 101 through lines, and the CPU controls the constituents according to control programs stored in the ROM. The control unit 106 includes a display unit and is capable of displaying various kinds of information.

Based on the information measured by the measuring unit 122, the control unit 106 controls the operations of the mold holding mechanism 103, the substrate stage 104, and the ejection device 10. The control unit 106 may be formed integrally with another part of the imprint apparatus 101 or may be implemented as a different device separated from the imprint apparatus. The control unit 106 may be formed of multiple computers instead of a single computer.

The housing 123 includes a base surface plate 124 on which the substrate stage 104 is placed, a bridge surface plate 125 to which the mold holding mechanism 103 is fixed, and a post 126 extending from the base surface plate 124 to support the bridge surface plate 125.

The imprint apparatus 101 includes a mold transport mechanism (not illustrated) that transports the mold 107 from the outside of the apparatus to the mold holding mechanism 103 and a substrate transport mechanism (not illustrated) that transports the substrate 111 from the outside of the apparatus to the substrate stage 104.

<Ejection Device>

Figure 2:
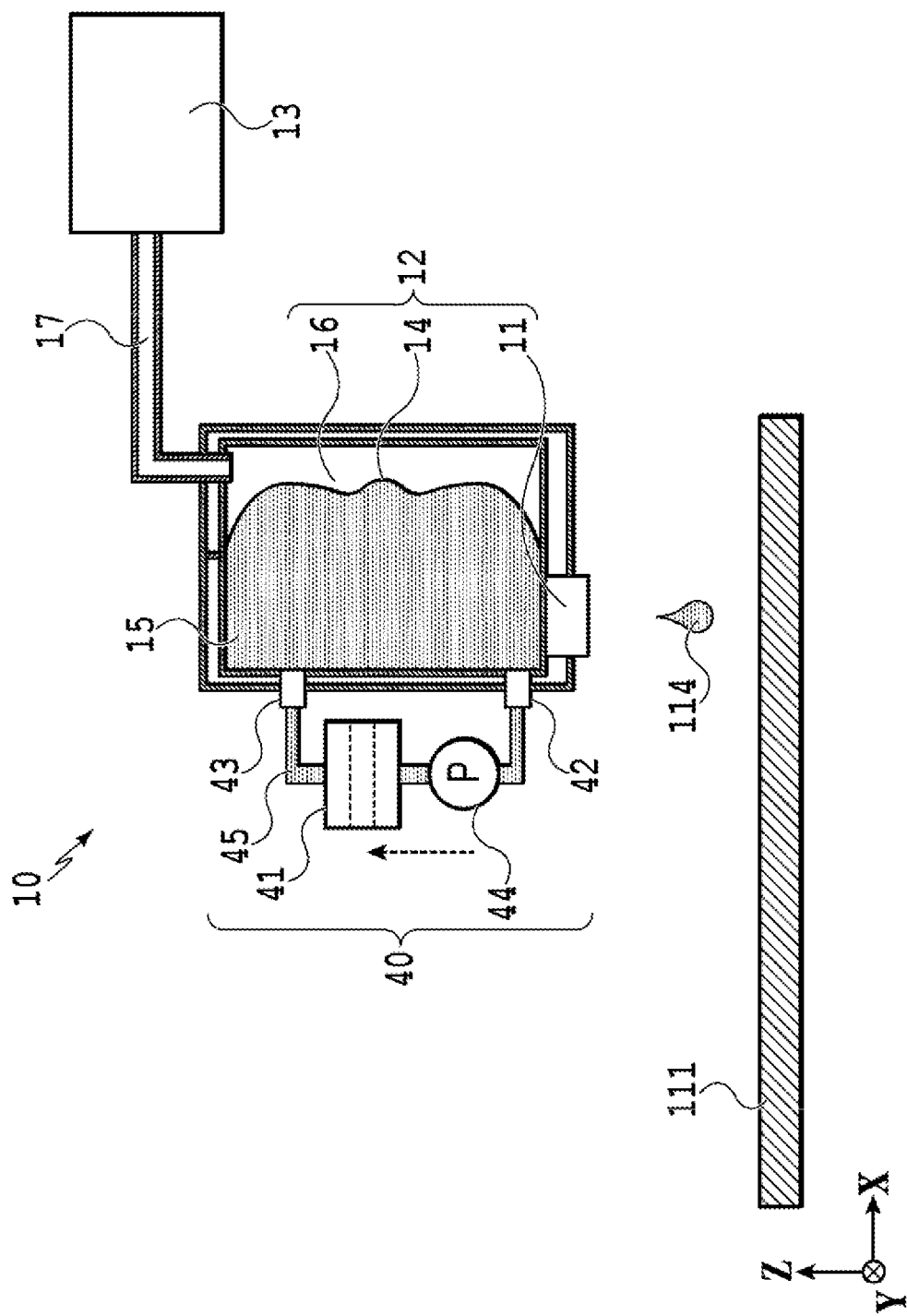
FIG. 2 is a diagram illustrating an example of a configuration of an ejection device.

FIG. 2 is a diagram illustrating an example of a configuration of the ejection device 10 of the first embodiment. The ejection device 10 of the present embodiment includes an ejection unit 11 (ejection head), a storing container 12 capable of storing the ejection material 114, a pressure control unit 13 that controls a pressure, and a circulation unit 40 that circulates the ejection material in the ejection unit 11.

A separation film 14 formed of a flexible member is provided in the storing container 12 to separate the space. The inside of the storing container 12 is separated by the separation film 14 into a first liquid chamber 15 and a second liquid chamber 16. The thickness of the separation film 14 is preferably 10 μm or more and 200 μm or less, and the separation film 14 is preferably formed of a material through which the ejection material and gas are unlikely to pass. The separation film 14 can be formed of a fluororesin film such as PFA or a compound multilayer film in which a fluororesin material and a plastic material are combined, for example.

The first liquid chamber 15, which is one of the sections of the storing container 12 separated by the separation film 14, stores the ejection material 114. The first liquid chamber 15 is connected with the ejection unit 11. That is, the ejection unit 11 ejects the ejection material 114 stored in the first liquid chamber 15. The second liquid chamber 16, or the other separated section, stores filling liquid. The second liquid chamber 16 is connected with the pressure control unit 13 through a connection pipe 17. The second liquid chamber 16 is not connected with the ejection unit 11. The filling liquid stored in the second liquid chamber 16 is not ejected from the ejection unit 11 but is used to control the pressure in the storing container 12.

The pressure control unit 13 includes a filling liquid tank, a pipe, a valve, a pressure sensor, a pump, a valve, and so on that are not illustrated, and thus the pressure control unit 13 can control the pressure in the second liquid chamber 16. With the pressure control unit 13 controlling the pressure on the filling liquid in the second liquid chamber 16, it is possible to control the pressure on the ejection material 114 in the first liquid chamber 15 through the separation film 14. With this, it is possible to stabilize the shape of the gas-liquid interface in the ejection unit 11 and to eject the ejection material 114 on the substrate 111 with excellent reproducibility. For example, the pressure control unit 13 controls the ejection unit 11 to have a little more negative pressure than the atmospheric pressure (outside atmospheric pressure) by controlling the internal pressure in the storing container 12 to be a pressure more negative than the atmospheric pressure. With this negative pressure control, in an ejection port 19 ejecting the ejection material 114 (see FIG. 3), the ejection material 114 forms a meniscus on an interface with the outside air, and leaking of the ejection material 114 from the ejection port 19 at an unintentional timing is prevented. The pressure control unit 13 is configured to maintain the pressure by supplying the second liquid chamber 16 with the filling liquid if the ejection material 114 in the first liquid chamber 15 is consumed and decreased due to the ejection.

In the circulation unit 40, a passage 45 including two ends connected to the storing container 12 is provided outside the storing container 12, and a filter 41 and a pump 44 are arranged in the passage 45. The circulation unit 40 is connected with the first liquid chamber 15 of the storing container 12. The passage 45 includes a first opening 42 and a second opening 43 connected with the first liquid chamber 15 and communicates with the first liquid chamber 15 through the first opening 42 and the second opening 43. The first opening 42 is an opening that supplies the inside of the passage 45 with the ejection material 114 in the first liquid chamber 15. The second opening 43 is an opening that supplies the first liquid chamber 15 with the ejection material 114 supplied from the first opening 42 to the inside of the passage 45. In the passage 45 connecting the first opening 42 and the second opening 43, the pump 44 and the filter 41 that filtrates the ejection material 114 are arranged. Considering the probability of an occurrence of a foreign substance in the ejection material 114 due to dust generated from the pump 44, it is favorable to arrange the filter 41 at a position that is downstream of the pump 44 in the case where the ejection material 114 flows from the first opening 42 to the second opening 43.

Although it is preferred to provide the pump 44 in the passage 45, the pump 44 may be provided outside the passage 45. Once the pump 44 is driven, the ejection material 114 stored in the first liquid chamber 15 is supplied from the first opening 42 to the passage 45. The ejection material 114 supplied from the first opening 42 is filtrated by passing through the filter 41 in the passage and returns to the inside of the first liquid chamber 15 by way of the second opening 43. The ejection material 114 is then supplied from the first opening 42 again. That is, the ejection material 114 in the first liquid chamber 15 is filtrated by the filter 41 while circulating.

The example in which the ejection device 10 of the present embodiment includes the storing container 12 provided with the separation film 14 to have the first liquid chamber 15 and the second liquid chamber 16 is described; however, the configuration is not limited thereto. The inside of the storing container 12 may not be provided with the separation film 14 and the second liquid chamber 16 but only provided with the first liquid chamber 15 storing the ejection material 114. In any case, any configuration may be applicable as long as the ejection of the ejection material 114 from the ejection unit 11 is properly performed and a control by the pressure control unit 13 to inhibit leaking of the ejection material 114 from the ejection port 19 is performed.

Figure 3:
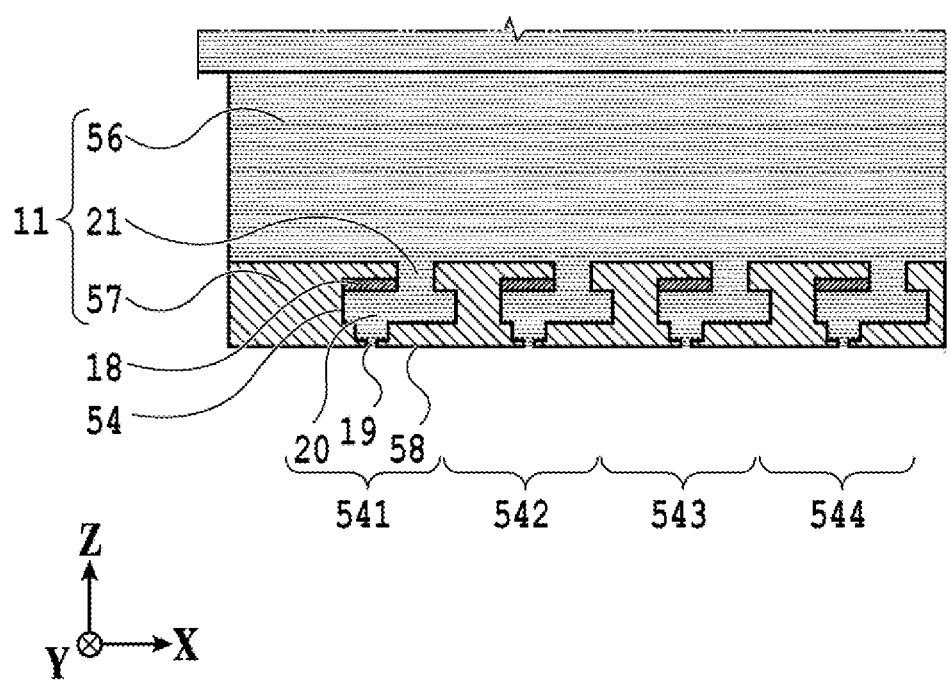
FIG. 3 is an enlarged cross-sectional view illustrating an ejection unit.

FIG. 3 is an enlarged cross-sectional view illustrating the ejection unit 11. The ejection unit 11 includes a common liquid chamber 56 and a module substrate 57. In the module substrate 57, there are arranged multiple nozzles 54 each including a supply port 21 that supplies the module substrate 57 with the ejection material 114 from the common liquid chamber 56 and the ejection port 19 capable of ejecting the ejection material 114. Each nozzle 54 is provided with a pressure chamber 20 and a piezoelectric element 18 as an energy generation element provided inside the nozzle 54 and that generates energy for ejecting the ejection material 114. The multiple nozzles 54 are indicated as nozzles 541, 542, 543, and 544. The nozzles 54 are arranged to be aligned in the X direction and the Y direction.

The piezoelectric element 18 is used as the energy generation element since the ejection material 114 to be used in the present embodiment contains a lot of resin. A surface of the module substrate 57 in which the ejection port 19 is provided is referred to as an ejection port side surface 58. That is, the ejection port side surface 58 is a surface corresponding to the substrate 111 illustrated in FIG. 1, for example. The liquid-repellent processing is applied to the ejection port side surface 58. The opening area of the ejection port 19 is smaller than the opening area of the supply port 21, and the cross-sectional area thereof is the smallest in a channel in the nozzle 54.

The supply port 21 communicates with the ejection port 19 in the module substrate 57. The ejection material 114 supplied from the supply port 21 to the inside of a nozzle between the piezoelectric element 18 and the ejection port 19 (pressure chamber 20) is ejected on the substrate 111 from the ejection port 19 with the control unit 106 driving the piezoelectric element 18. The ejection unit 11 is preferably an ejection head used in an inkjet head or the like. A residual vibration that is generated after forcibly vibrating the piezoelectric element 18 by applying a driving pulse to the piezoelectric element 18 is detected as back electromotive force by the same piezoelectric element 18. This back electromotive force is detected by each nozzle 54 (that is, by each piezoelectric element 18 of the corresponding nozzle 54).

In the present embodiment, as described above, leaking of the ejection material 114 from the ejection port 19 at an unintentional timing is inhibited by the pressure control (negative pressure control) by the pressure control unit 13. If a phenomenon in which the pressure control is not properly performed occurs because of some sort of reason, there may be a case that the ejection material 114 leaks out of the ejection port 19. In the present embodiment, leaking of the ejection material 114 is detected promptly by using the back electromotive force. In the present embodiment, the back electromotive force obtained by applying a driving pulse of a voltage that is as small as not causing ejection of the ejection material 114 to each piezoelectric element 18 is detected. For example, if the ejection material 114 is ejected from the ejection port, a driving pulse of ±10V is applied to the piezoelectric element 18. On the other hand, if a wetness of the ejection port side surface 58 as described in the present embodiment is detected, a driving pulse of ±6V is applied to the piezoelectric element 18. In other words, the step of detecting the wetness in the present embodiment is executed in a timing other than the timing of ejecting the ejection material 114 onto the substrate 111.

<Back Electromotive Force>

Figure 4A:
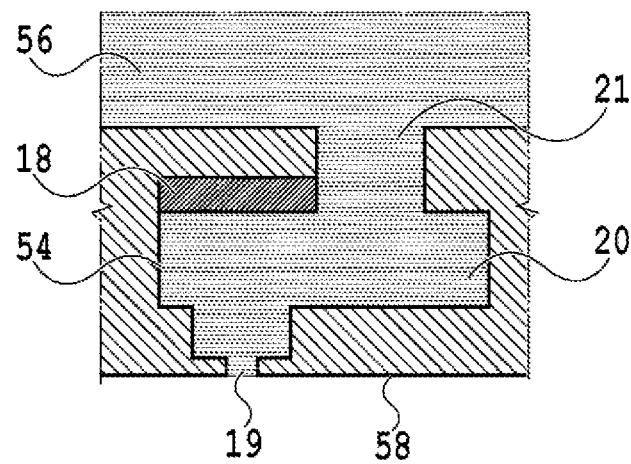
FIGS. 4A to 4C are enlarged views of a nozzle.
Figure 4B:
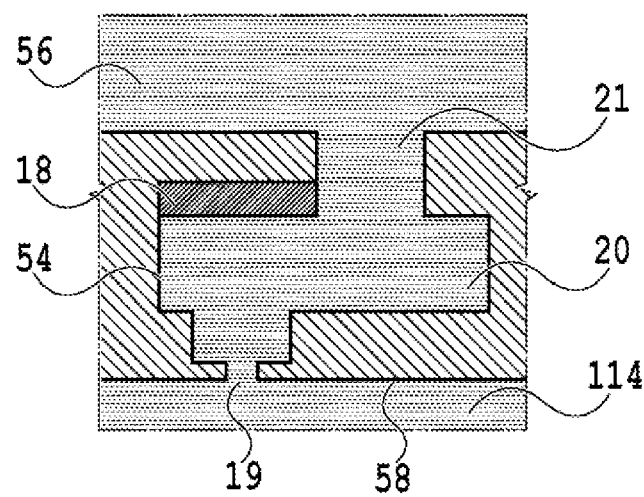
Figure 4C:
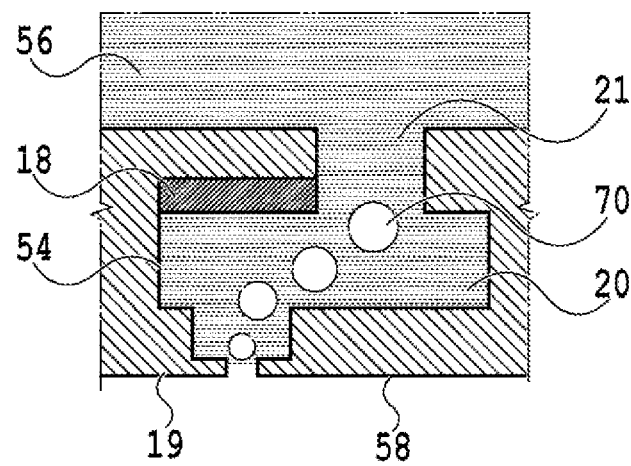
Figure 5A:
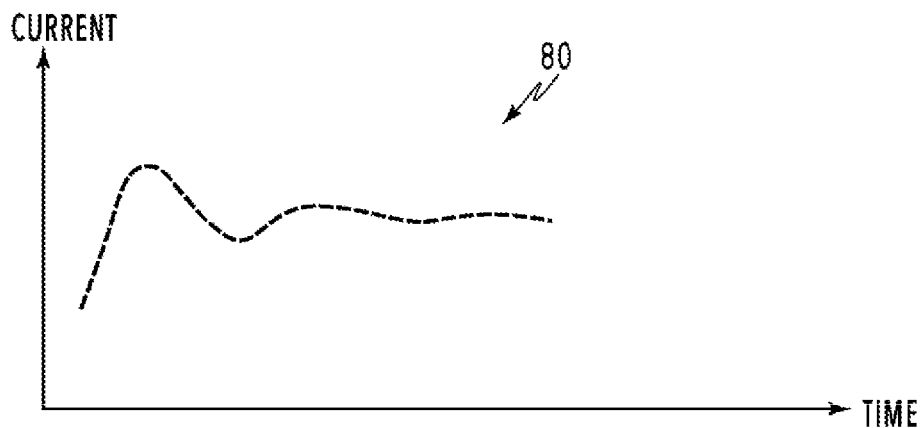
FIGS. 5A to 5C are graphs of a back electromotive force waveform.
Figure 5B:
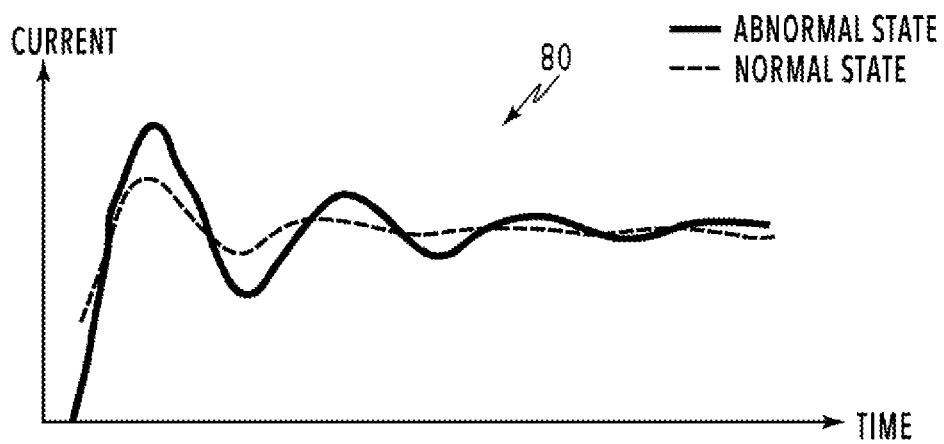
Figure 5C:
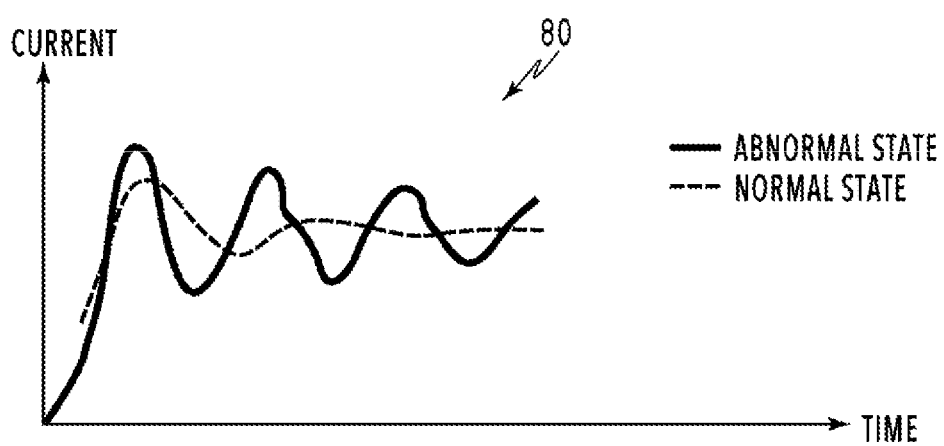

FIGS. 4A to 4C are enlarged views of the nozzle 54 illustrated in FIG. 3. FIGS. 5A to 5C are graphs of a back electromotive force waveform. Hereinafter, the back electromotive force waveform detected by the piezoelectric element 18 in the first embodiment is described with reference to the enlarged views of the nozzle 54 illustrated in FIGS. 4A to 4C and the graphs of a back electromotive force waveform 80 illustrated in FIGS. 5A to 5C. The graphs of the back electromotive force waveform 80 illustrated in FIGS. 5A to 5C indicate values experimentally obtained in the states described below.

FIG. 4A illustrates a state of the nozzle 54 in which the ejection port side surface 58 is not wet with the ejection material 114. That is, FIG. 4A illustrates a state in which the pressure control is properly performed and the ejection material 114 does not leak out of the ejection port 19. If a driving pulse (for example, voltage of ±6V) for obtaining a back electromotive force waveform is applied to the piezoelectric element 18 of such a nozzle 54 and the back electromotive force is obtained, the graph of the back electromotive force waveform 80 as illustrated in FIG. 5A is obtained. That is, FIG. 5A indicates the back electromotive force waveform 80 in the normal state in which the ejection material 114 does not leak out of the ejection port 19.

FIG. 4B illustrates a state of the nozzle 54 in which the ejection port side surface 58 is wet with the ejection material 114. If the driving pulse for obtaining the back electromotive force waveform is applied to the piezoelectric element 18 of this nozzle 54 and the back electromotive force is obtained, the graph of the back electromotive force waveform 80 in the abnormal state indicated by a solid line in FIG. 5B is obtained. The obtained waveform has a more increased amplitude and a slower phase than that of the waveform in a normal state indicated by a broken line. That is, if the back electromotive force waveform 80 changed from the back electromotive force waveform of the normal state is obtained as indicated by the solid line in FIG. 5B, it is possible to detect that the ejection port side surface 58 of the nozzle 54 including the piezoelectric element 18 is wet with the ejection material 114.

FIG. 4C illustrates a state of the nozzle 54 in which the ejection port side surface 58 is not wet with the ejection material 114 but air bubbles 70 flow into the nozzle 54 from the ejection port 19. If the driving pulse for obtaining the back electromotive force waveform is applied to the piezoelectric element 18 of this nozzle 54 and the back electromotive force is obtained, the graph of the back electromotive force waveform 80 as illustrated in FIG. 5C is obtained. The obtained waveform has a more increased amplitude and a shorter cycle than that of the waveform in the normal state indicated by the broken line. That is, if the back electromotive force waveform 80 changed from the back electromotive force waveform of the normal state is obtained as indicated by the solid line in FIG. 5C, it is possible to detect that the air bubbles 70 flow into the ejection port 19 of the nozzle 54 including the piezoelectric element 18.

As described above, it is possible to detect whether there is a wetness of the ejection port side surface 58 of each piezoelectric element 18 by obtaining the back electromotive force waveform 80 of the piezoelectric element 18. The back electromotive force waveform 80 as illustrated in FIG. 5B or 5C may be obtained also in a case of an abnormal phenomenon other than the leaking of the ejection material 114. Thus, in the present embodiment, a wetness of the ejection port side surface 58 is detected based on the back electromotive force waveform 80 obtained in the continuing multiple nozzles 54.

The back electromotive force waveform 80 illustrated in FIGS. 5A to 5C is transmitted to the control unit 106 through a control substrate (not illustrated) of the ejection device 10 from the piezoelectric element 18. If the back electromotive force waveform 80 illustrated in FIG. 5B or 5C is transmitted to the control unit 106, for example, the control unit 106 detects that the ejection port side surface 58 is wet.

Figure 6A:
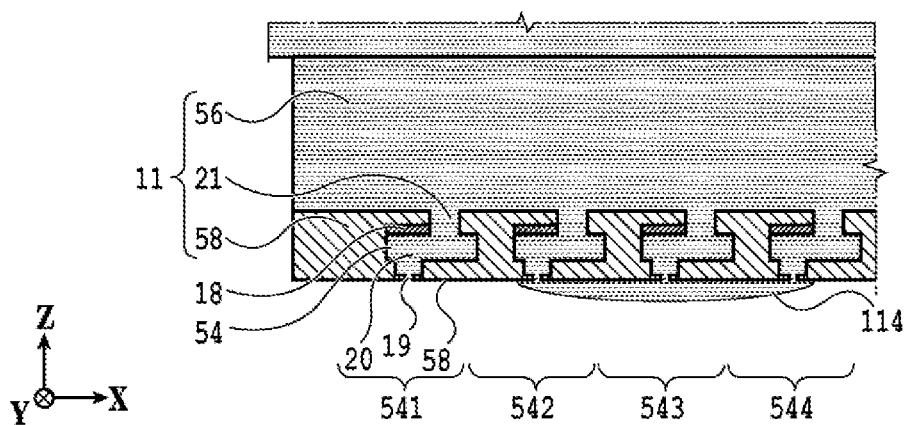
FIGS. 6A to 6C are diagrams illustrating an example in which an ejection port side surface is getting wet.
Figure 6B:
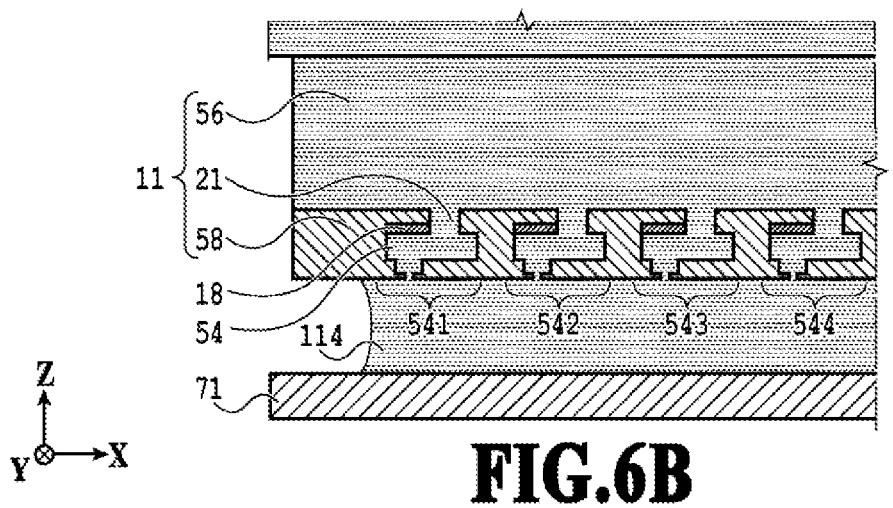
Figure 6C:
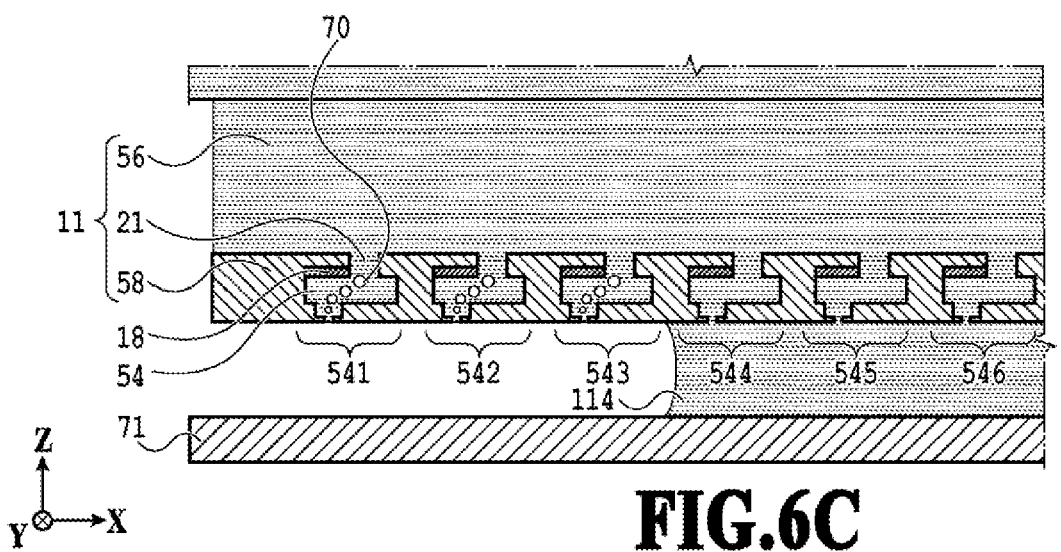

FIGS. 6A, 6B, and 6C are diagrams illustrating an example in which the ejection port side surface 58 is getting wet. FIGS. 6A to 6C illustrate an example in which the degree of the wetness is increased in this order.

FIG. 6A illustrates the nozzle 541 in which the ejection port side surface 58 is not wet with the ejection material 114 and the continuing multiple nozzles (the nozzles 542, 543, and 544) in which the ejection port side surface 58 is wet with the attached liquid droplet of the ejection material 114. For example, the illustrated example shows that the pressure control is not properly performed, and the ejection material 114 leaks out of some of the nozzles. If the back electromotive force is detected in each nozzle in this state, the back electromotive force waveform 80 as illustrated in FIG. 5A is obtained in the nozzle 541. On the other hand, the back electromotive force waveform 80 as illustrated in FIG. 5B is obtained in the nozzles 542, 543, and 544. Thus, it is detected that the ejection port side surface 58 around the continuing three nozzles is wet with the ejection material 114. If it is detected that the continuing three nozzles 54 are wet with the ejection material 114, the control unit 106 preferably displays the determination that the ejection port side surface 58 is wet as an error. The sign of the error may be displayed on the display unit (display) included in the control unit 106 of the imprint apparatus 101, or an indicator light indicating the error may be lighted up. The error may be displayed on another display device connected with the control unit 106. For example, if the ejection material 114 continuously leaks out of three nozzles (150 μm×3), the liquid droplets may communicate with the substrate 111 and a liquid column as described below is likely to be formed. Thus, if the back electromotive force waveform 80 indicating the leaking of the ejection material 114 out of the continuing multiple nozzles (three nozzles in this example), the control unit 106 determines that the ejection port side surface 58 is wet, and the error displaying is performed.

FIG. 6B illustrates the situation in which the ejection material 114 forms a liquid column between the ejection port side surface 58 and a substrate 71. The substrate 71 is not limited to the substrate 111 onto which the ejection material 114 is dropped. For example, the substrate 71 may be a structure provided at a position near the ejection device 10 in a place in which the ejection device 10 stands by in a case of not performing the ejection operation. Regardless of the type of the substrate 71, if there is a structure such as the substrate 71 at a position facing the ejection unit 11, and the ejection material 114 spreads to wet the structure, a liquid column is formed, and the ejection material 114 keeps flowing. If the back electromotive force is detected in each nozzle and the ejection material 114 forms a liquid column as illustrated in FIG. 6B, the back electromotive force waveform 80 as illustrated in FIG. 5B is obtained in the nozzles 541 to 544. That is, it is possible to detect that the ejection port side surface 58 around the continuing three or more nozzles is wet with the ejection material 114. In the case where it is detected that the continuing three or more nozzles 54 are wet with the ejection material 114 as described above, the control unit 106 preferably displays the determination that the ejection port side surface 58 is wet as an error like the example described in FIG. 6A. Depending on the degree of the wet spreading, the fact in which the ejection port side surface 58 is wet with the ejection material 114 may be detected in the state of FIG. 6A or may be detected in the state of FIG. 6B. In either case, it is detected that the ejection port side surface 58 is wet if the back electromotive force waveform 80 as illustrated in FIG. 5B is obtained in the multiple continuing nozzles 54.

FIG. 6C illustrates a situation in which the ejection material 114 forms a liquid column between the ejection port side surface 58 and the substrate 71, and also there are continuing three or more nozzles (see the nozzles 541, 542, and 543) in which the air bubbles 70 enter the nozzles from the ejection ports 19 as illustrated in FIG. 4C. In this case, so-called gas-liquid exchange in which air bubbles enter the nozzles 541, 542, and 543 and the ejection material 114 flows out of the nozzles 544, 545, and 546 occurs. That is, if the gas-liquid exchange occurs in the state of FIG. 6B, the state progresses to the state of FIG. 6C. Once the gas-liquid exchange occurs, the leaking speed of the ejection material 114 is increased, and the effect of the wetness is amplified.

If the back electromotive force is detected in each nozzle in the case of FIG. 6C, the back electromotive force waveform 80 as illustrated in FIG. 5C is obtained in the nozzles 541, 542, and 543. In the nozzles 544, 545, and 546, the back electromotive force waveform 80 as illustrated in FIG. 5B is obtained. Thus, the control unit 106 detects that the air bubbles are mixed in continuing three or more nozzles 54 and also the ejection port side surface 58 around the continuing three or more nozzles 54 is wet with the ejection material 114. Consequently, the control unit 106 can determine that the gas-liquid exchange occurs and the ejection material 114 leaks. If the control unit 106 determines that the gas-liquid exchange occurs and the ejection material 114 leaks, it is preferable to display the fact as an error.

The step of detecting the back electromotive force in each nozzle 54 as described above is executed while the ejection of the ejection material 114 is not performed. Specifically, the detecting step may be performed before or after the ejection or in both timings. More specifically, if the ejection (dispensing) and the imprint operation (transfer operation) by the impressing by the mold 107 are performed repeatedly for every shot in the imprint apparatus 101, for example, the step of detecting the back electromotive force may be performed in standby time between the shots. The shot is an operation of transferring the pattern to each imprint region on the substrate 111.

Figure 7B:
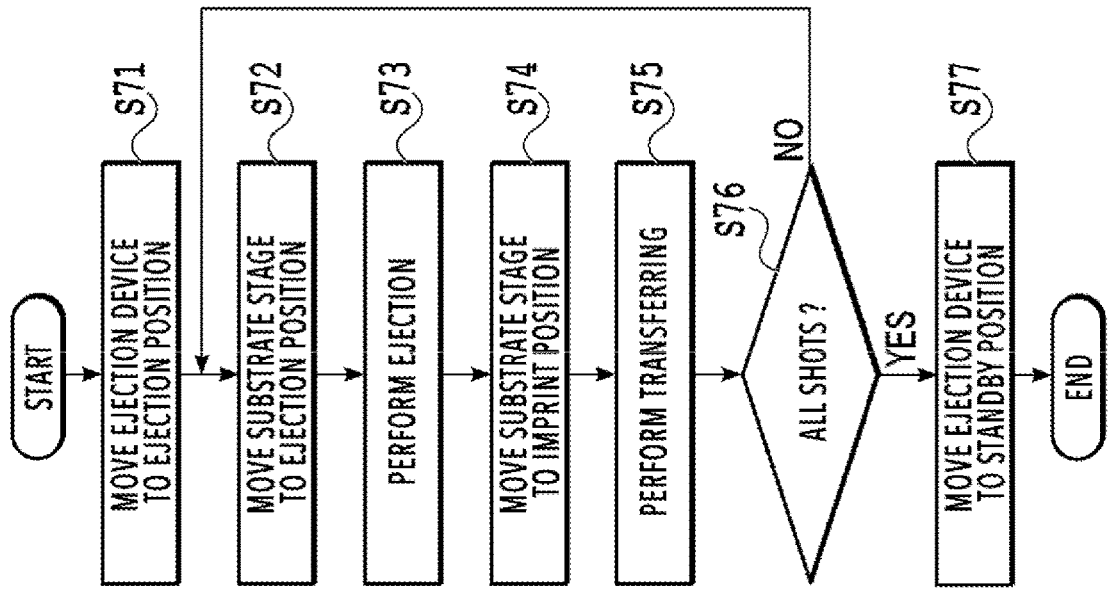
FIGS. 7A and 7B are diagrams describing shots in the imprint apparatus.
Figure 7A:
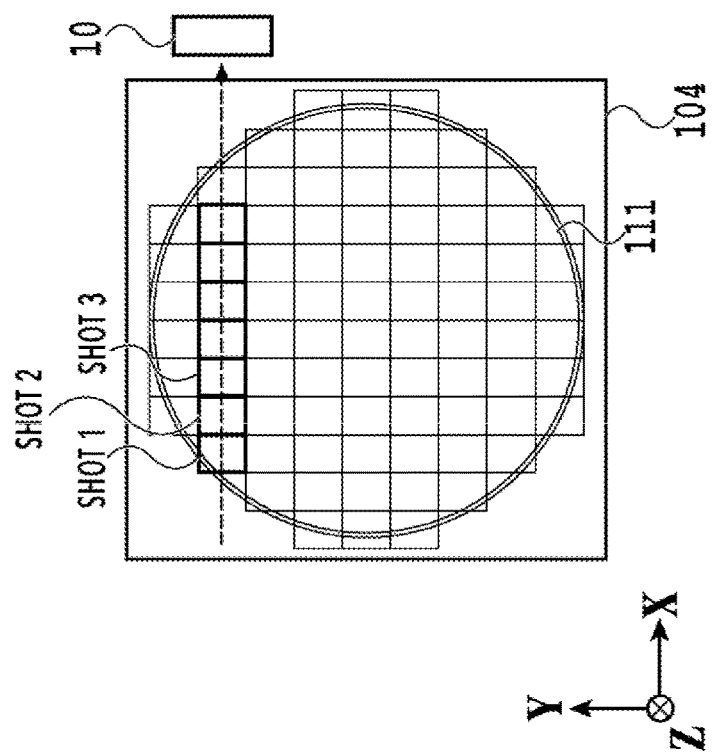

FIGS. 7A and 7B are diagrams describing the shots in the imprint apparatus 101. FIG. 7A is a plan view of the substrate 111, and rectangles on the substrate 111 each indicate the imprint region for each shot. The ejection device 10 performs the ejection operation and the imprint operation while changing the imprint region according to the movement in the X direction of the substrate stage 104. FIG. 7B is a flowchart indicating an example of the imprint steps. The ejection device 10 is positioned at a standby position before the imprint steps. In S71, the control unit 106 moves the ejection device 10 to an ejection position. In this process, the first liquid chamber 15 is controlled to have a negative pressure. In S72, the control unit 106 moves the substrate stage 104 including the substrate 111 to the ejection position as the processing target. In S73, the control unit 106 causes the ejection device 10 to perform the ejection operation. In S74, the control unit 106 moves the substrate stage 104 to an imprint position as the processing target. In S75, the control unit 106 performs the transfer operation. In S76, whether all the shots are completed is determined, and if all the shots are not completed, the process returns to S72 and repeats the processing. If all the shots are completed, in S77, the control unit 106 moves the ejection device 10 to the standby position.

If the ejection operation and the transfer operation are performed in each imprint region as described in FIGS. 7A and 7B, the detection step may be performed between S73 and S74, for example. The detection step may be performed in a timing before S71 or may be performed in a timing after S77. The detection step may not be performed between every shot and may be performed row by row on the substrate 111 or may be performed for each substrate 111.

The step of detecting the back electromotive force may be performed in the standby time while the imprint operation is not performed, such as during replacement of the substrate 111 (wafer) or maintenance of the imprint apparatus 101. In a case of replacing the ejection device 10, the step of detecting the back electromotive force may be performed before detaching the ejection device 10. After the ejection device 10 is replaced, the step of detecting the back electromotive force may be performed before the ejection is executed. Thus, it is possible to detect the leaking of the ejection material 114 and to minimize the leaking of the ejection material 114 by performing the detection step in various states.

As described above, according to the present embodiment, it is possible to detect the leaking of the ejection material 114 on the ejection port side surface 58. Thus, it is possible to inhibit the possible effect on the substrate 111 due to the unintentional leaking of the ejection material 114 from the ejection port 19.

Second Embodiment

In the first embodiment, the example in which the unintentional leaking of the ejection material 114 from the ejection port 19 is inhibited by controlling the pressure in the storing container 12 and the pressure in the ejection unit 11 communicating with the storing container 12 to negative pressures by the pressure control unit 13 is described. Additionally, the example of detecting the phenomenon in which the ejection material 114 leaks out of the ejection port 19 due to some sort of reason in this case is described.

Here is described an example of a second embodiment, which is an example of an apparatus configuration basically similar to that of the first embodiment but different in that whether the leaking occurs is detected by applying a positive pressure from the pressure control unit 13 to the storing container 12 and the ejection unit 11 communicating with the storing container 12. That is, an example of applying a positive pressure purposefully to see if there is a sign of the leaking.

FIG. 8 is a diagram describing a configuration of an ejection device 10 and is a diagram basically similar to FIG. 2 described in the first embodiment. FIG. 8 is different from FIG. 2 in that a positive pressure is applied from the pressure control unit 13 to the inside of the second liquid chamber 16 as indicated by an arrow 800 in FIG. 8. Other configurations are same as that of the first embodiment, and the descriptions thereof are omitted.

The positive pressure applied to the second liquid chamber 16 is applied to the ejection material 114 in the first liquid chamber 15 through the separation film 14. This positive pressure is a positive pressure that causes no leaking of the ejection material 114 from the ejection port 19 in the normal state. The positive pressure that causes no leaking of the ejection material 114 from the ejection port 19 is determined depending on the size of the ejection port 19, the state of the ejection port side surface 58, the physical properties of the ejection material 114, or the like. Note that, if the ejection port 19 has a break such as a flaw, or if there is a foreign substance (trash) in the ejection port 19, the ejection material 114 leaks out of the ejection port 19 even though the positive pressure that causes no leaking of the ejection material 114 from the ejection port 19 in the normal state is applied.

Figure 9A:
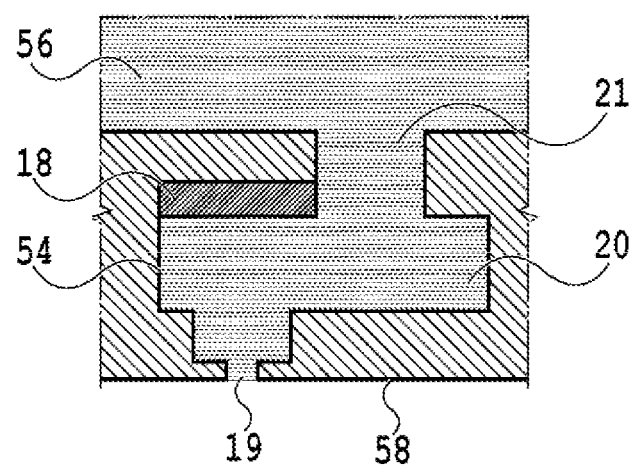
FIGS. 9A and 9B are diagrams describing an example in which there is trash in the ejection port.
Figure 9B:
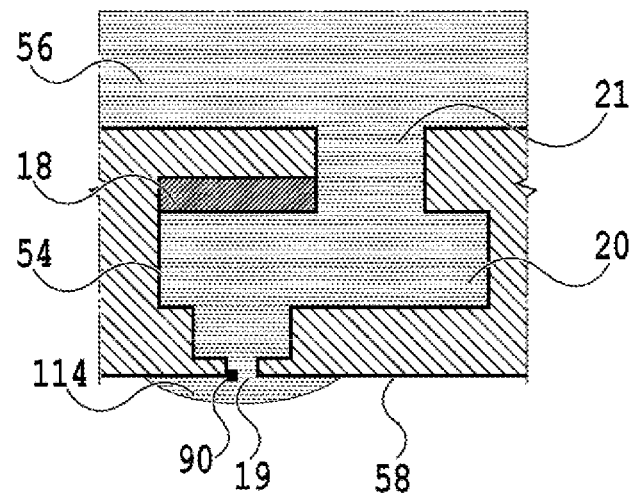

FIGS. 9A and 9B are diagrams describing an example in which there is trash in the ejection port. FIG. 9A is a diagram of a case in which the positive pressure that causes no leaking of the ejection material 114 from the ejection port 19 in the normal state is applied to the normal ejection port 19. FIG. 9B is a diagram of a case in which the positive pressure that causes no leaking of the ejection material 114 from the ejection port 19 in the normal state is applied to the normal ejection port 19 while there is trash 90 in the ejection port 19. In the case of FIG. 9B, the ejection material 114 leaks to the ejection port side surface 58.

Likewise, also in a case where the ejection port side surface 58 is in the abnormal state with a flaw and is likely to be wet more than normal, or in a case where there is trash on the ejection port side surface 58, the ejection material 114 leaks out of the ejection port 19 once the positive pressure is applied. In order to detect whether the ejection material 114 leaks out of the ejection port 19, the driving pulse for obtaining the back electromotive force waveform is applied to the piezoelectric element 18 as described in the first embodiment, and thus the back electromotive force waveform is obtained. Then, it is possible to detect the leaking of the ejection material 114 to the ejection port side surface 58 based on the obtained back electromotive force waveform. In this way, in the present embodiment, whether the ejection material 114 is leaking is detected by applying the positive pressure. That is, in the present embodiment, some sort of state abnormality is detected in the individual ejection ports 19. Thus, the back electromotive force waveform obtained by applying the positive pressure in the second embodiment can achieve processing of detecting the leaking based on a detection result of a single nozzle 54 even if the leaking is not detected in multiple continuing nozzles 54.

In a case where the ejection material 114 leaks out of the ejection port 19, it is difficult to perform stable ejection. In this case, an ejection failure may occur. For this reason, it is favorable to display an error sign to notify the user of the failure. The ejection port 19 from which the ejection material 114 leaks may be set as an unavailable ejection port 19. An ejection port as the alternative of the ejection port 19 from which the ejection material 114 leaks may be set to perform the ejection from the alternative ejection port, and a dropping recipe may be changed to complement the ejection from the unavailable ejection port. The ejection unit 11 including the ejection port 19 from which the ejection material 114 leaks may be replaced. A replacement sign indicating the replacement of the ejection unit 11 may be displayed on the display unit. The leaking of the ejection material 114 may be made less by generating a negative pressure in the second liquid chamber 16 from the pressure control unit 13 (increasing the absolute value of the negative pressure) and generating a negative pressure in the ejection material 114 in the first liquid chamber 15 through the separation film 14.

The operation of applying the driving pulse for obtaining the back electromotive force waveform may be performed in the standby time while the ejection device 10 is positioned at the standby position. The operation may be performed before the ejection device 10 is moved to the ejection position.

As described above, in the present embodiment, it is possible to promptly detect the ejection port 19 having some sort of state abnormality.

Third Embodiment

The example of detecting the leaking of the ejection material 114 from the ejection port 19 by applying the positive pressure from the pressure control unit 13 to the ejection unit 11 and using the back electromotive force waveform is described in the second embodiment. In the present embodiment, an example in which an image capturing unit that captures an image of the ejection port 19 is provided, and the image captured by the image capturing unit is used to detect the leaking of the ejection material 114 from the ejection port 19 is described.

FIG. 10 is a diagram describing a configuration of the ejection device 10 and is a diagram also including a part of a configuration of the imprint apparatus 101. The present embodiment is different from the second embodiment in that the substrate stage 104 holding the substrate 111 is provided with an image capturing unit 1000 capable of capturing an image of the ejection port 19. Other configurations are same as that of the second embodiment, and thus descriptions thereof are omitted. That is, the example of applying the positive pressure from the pressure control unit 13 to the inside of the second liquid chamber 16 as illustrated in FIG. 10 is also described in the present embodiment. The positive pressure applied to the second liquid chamber 16 is applied to the ejection material 114 in the first liquid chamber 15 through the separation film 14. As with the second embodiment, the positive pressure is the positive pressure that does not cause the ejection material 114 to leak out of the ejection port 19 in the normal state. In this state, the image capturing unit 1000 captures an image of the ejection port 19.

Figure 11:
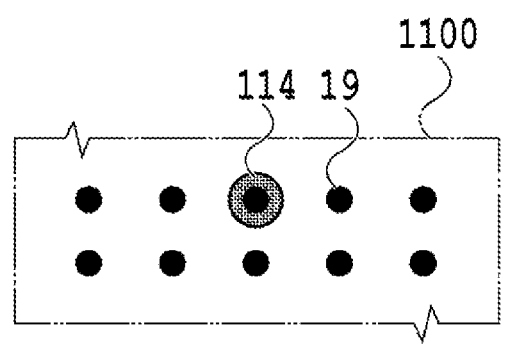
FIG. 11 is a diagram illustrating an example of a captured image of ejection ports.

FIG. 11 is a diagram illustrating an example of a captured image 1100 of some of the ejection ports 19. There is an ejection port 19 from which the ejection material 114 leaks in FIG. 11. If the ejection port 19 has a break such as a flaw, or if there is trash in the ejection port 19, the ejection material 114 leaks out of the ejection port 19 even though the positive pressure that causes no leaking of the ejection material 114 from the ejection port 19 in the normal state is applied. Also, in the case where the ejection port side surface 58 has a flaw and is likely to be wet more than normal, or in the case where there is trash in the ejection port side surface 58, the ejection material 114 leaks out of the ejection port 19 even though the positive pressure that causes no leaking of the ejection material 114 from the ejection port 19 in the normal state is applied.

The control unit 106 can determine whether there is the leaking by recognizing the leaking ejection material 114 from the image captured by the image capturing unit 1000. The various aspects performed in the case where the abnormal ejection port 19 is detected are similar to that in the example described in the second embodiment, and descriptions thereof are omitted.

As described above, in the present embodiment, it is possible to promptly detect the ejection port 19 having some sort of state abnormality.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-165640, filed Sep. 11, 2019, which is hereby incorporated by reference wherein in its entirety.

What is claimed is:

1. An ejection device, including:
   an ejection unit provided with an ejection port configured to eject an ejection material;
   a piezoelectric element provided in the ejection unit and configured to cause the ejection material to be ejected from the ejection port;
   a first liquid chamber connected to the ejection unit and configured to supply the ejection unit with the ejection material;
   a pressure control unit configured to control a pressure in the ejection unit by controlling a pressure in the first liquid chamber and control the first liquid chamber to have a negative pressure while the ejection material is ejected by the piezoelectric element; and
   a detection unit configured to detect a wetness on a surface of the ejection port with a back electromotive force obtained by the piezoelectric element.

2. The ejection device according to claim 1, wherein the detection unit is configured to detect the wetness in a state where the pressure control unit controls the first liquid chamber to have a positive pressure.

3. The ejection device according to claim 1, wherein the detection unit is configured to detect that the surface of the ejection port is wet according to a change of a back electromotive force waveform obtained by the piezoelectric element in a state where the ejection is not performed from a back electromotive force waveform in a normal state.

4. The ejection device according to claim 3, wherein the change of the back electromotive force waveform is that an amplitude is increased more and a phase is slower than that of the back electromotive force waveform in the normal state.

5. The ejection device according to claim 3, wherein the change of the back electromotive force waveform is that an amplitude is increased more and a cycle is shorter than that of the back electromotive force waveform in the normal state.

6. The ejection device according to claim 1, wherein the detection unit is configured to detect that surfaces of a plurality of ejection ports that are at least continuous are wet in a case where any one of back electromotive force waveforms obtained by a plurality of the piezoelectric elements corresponding to the plurality of ejection ports is changed from a back electromotive force waveform in a normal state.

7. The ejection device according to claim 1, wherein the piezoelectric element is configured to obtain a back electromotive force waveform by applying a driving pulse of a voltage lower than a voltage used in a case where the piezoelectric element causes the ejection of the ejection material.

8. The ejection device according to claim 1, further comprising:
   a storing container that includes the first liquid chamber and a second liquid chamber that is separated from the first liquid chamber by a flexible member and stores filling liquid,
   wherein the pressure control unit is configured to control a pressure by supplying the second liquid chamber with the filling liquid according to a decrease of the ejection material stored in the first liquid chamber.

9. The ejection device according to claim 1, wherein error displaying is performed if the detection unit detects leaking of the ejection material.

10. The ejection device according to claim 1, wherein an ejection port in which leaking of the ejection material is detected is set as an unavailable ejection port if the detection unit detects leaking of the ejection material.

11. The ejection device according to claim 10, wherein ejection from the ejection port set as the unavailable ejection port is compensated by ejection from another ejection port.

12. The ejection device according to claim 1, wherein the pressure control unit is configured to increase an absolute value of a negative pressure in the ejection unit by increasing an absolute value of a negative pressure in the first liquid chamber if the detection unit detects leaking of the ejection material.

13. The ejection device according to claim 1, wherein displaying to indicate replacement of the ejection unit is performed if the detection unit detects leaking of the ejection material.

14. The ejection device according to claim 1, wherein the detection unit is configured to perform the detection before an ejection operation from the ejection port is performed.

15. The ejection device according to claim 1, wherein the detection unit is configured to perform the detection while the ejection unit is positioned at a standby position.

16. An imprint apparatus configured to use the ejection device according to claim 1 to eject a resin as the ejection material on a substrate, put a surface of a mold on which a bumpy pattern is formed in contact with the resin ejected on the substrate, and cure the resin to form a bumpy pattern.

17. The imprint apparatus according to claim 16, wherein the detection unit is configured to perform the detection during standby time of the imprint operation including a timing between shots.

* * * * *